US010119194B2

(12) United States Patent
Carlson

(10) Patent No.: US 10,119,194 B2
(45) Date of Patent: Nov. 6, 2018

(54) INDEXED GAS JET INJECTOR FOR SUBSTRATE PROCESSING SYSTEM

(71) Applicant: APPLIED MATERIALS, INC., Santa Clara, CA (US)

(72) Inventor: David K. Carlson, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 625 days.

(21) Appl. No.: 14/766,863

(22) PCT Filed: Feb. 18, 2014

(86) PCT No.: PCT/US2014/016878
§ 371 (c)(1),
(2) Date: Aug. 10, 2015

(87) PCT Pub. No.: WO2014/158457
PCT Pub. Date: Oct. 2, 2014

(65) Prior Publication Data
US 2015/0376793 A1 Dec. 31, 2015

Related U.S. Application Data

(60) Provisional application No. 61/777,569, filed on Mar. 12, 2013.

(51) Int. Cl.
C23C 16/54 (2006.01)
C23C 16/455 (2006.01)
(Continued)

(52) U.S. Cl.
CPC .......... *C23C 16/54* (2013.01); *C23C 16/4587* (2013.01); *C23C 16/45504* (2013.01);
(Continued)

(58) Field of Classification Search
CPC ................ C23C 16/54; C23C 16/4587; C23C 16/45504; C23C 16/45563;
(Continued)

(56) References Cited

U.S. PATENT DOCUMENTS 3,930,908 A * 1/1976 Jolly ....................... C30B 25/14
117/102
5,601,651 A * 2/1997 Watabe .................. C23C 16/455
118/715

(Continued)

FOREIGN PATENT DOCUMENTS

JP 2006-324400 A 11/2006
JP 2012-134320 A 7/2012
(Continued)

OTHER PUBLICATIONS

PCT International Search Report dated May 30, 2014 for PCT Application No. PCT/US2014/016878.

*Primary Examiner* — Jeffrie R Lund
(74) *Attorney, Agent, or Firm* — Moser Taboada; Alan Taboada

(57) ABSTRACT

Apparatus for use in a substrate processing chamber are provided herein. In some embodiments, an indexed jet injector may include a body having a substantially cylindrical central volume, a gas input port disposed on a first surface of the body, a gas distribution channel formed in the body and fluidly coupled to the gas input port and to the cylindrical central volume, a gas distribution drum disposed within the cylindrical central volume and rotatably coupled to the body, the gas distribution drum having a plurality of jet channels formed through the gas distribution drum, and a plurality of indexer output ports formed on a second surface of the body, wherein each of the plurality of jet channels fluidly couple the gas input port to at least one of
(Continued)

the plurality of indexer output ports at least once per 360° rotation of the gas distribution drum.

20 Claims, 7 Drawing Sheets

(51) Int. Cl.
    *C23C 16/458*     (2006.01)
    *C30B 25/08*     (2006.01)
    *C30B 25/14*     (2006.01)
    *C30B 25/16*     (2006.01)
    *C30B 25/02*     (2006.01)

(52) U.S. Cl.
    CPC .. C23C 16/45519 (2013.01); C23C 16/45563 (2013.01); C23C 16/45589 (2013.01); C30B 25/08 (2013.01); C30B 25/14 (2013.01); C30B 25/165 (2013.01); *C23C 16/45578* (2013.01); *C30B 25/02* (2013.01); *C30B 25/025* (2013.01)

(58) Field of Classification Search
    CPC ........ C23C 16/45519; C23C 16/45589; C23C 16/45578; C30B 25/08; C30B 25/02; C30B 25/025; C30B 25/14; C30B 25/165
    See application file for complete search history.

(56) References Cited

U.S. PATENT DOCUMENTS

| | | | |
|---|---|---|---|
| 5,957,116 A * | 9/1999 | Haegele | ........... F02M 35/10052 123/568.12 |
| 7,481,902 B2 * | 1/2009 | Shinriki | ................ B08B 7/0035 156/345.29 |
| 2003/0183156 A1 * | 10/2003 | Dando | .................. C23C 16/452 117/84 |
| 2005/0074983 A1 * | 4/2005 | Shinriki | ................ B08B 7/0035 438/785 |
| 2007/0123007 A1 | 5/2007 | Furutani et al. | |
| 2007/0169687 A1 * | 7/2007 | Kordina | .................. C30B 25/00 117/88 |
| 2012/0027953 A1 | 2/2012 | Lee | |
| 2015/0376793 A1 * | 12/2015 | Carlson | ............ C23C 16/45504 118/715 |

FOREIGN PATENT DOCUMENTS

| | | |
|---|---|---|
| KR | 10-0825970 B1 | 4/2008 |
| KR | 20-0461589 B1 | 7/2012 |
| KR | 10-1206833 B1 | 12/2012 |

* cited by examiner

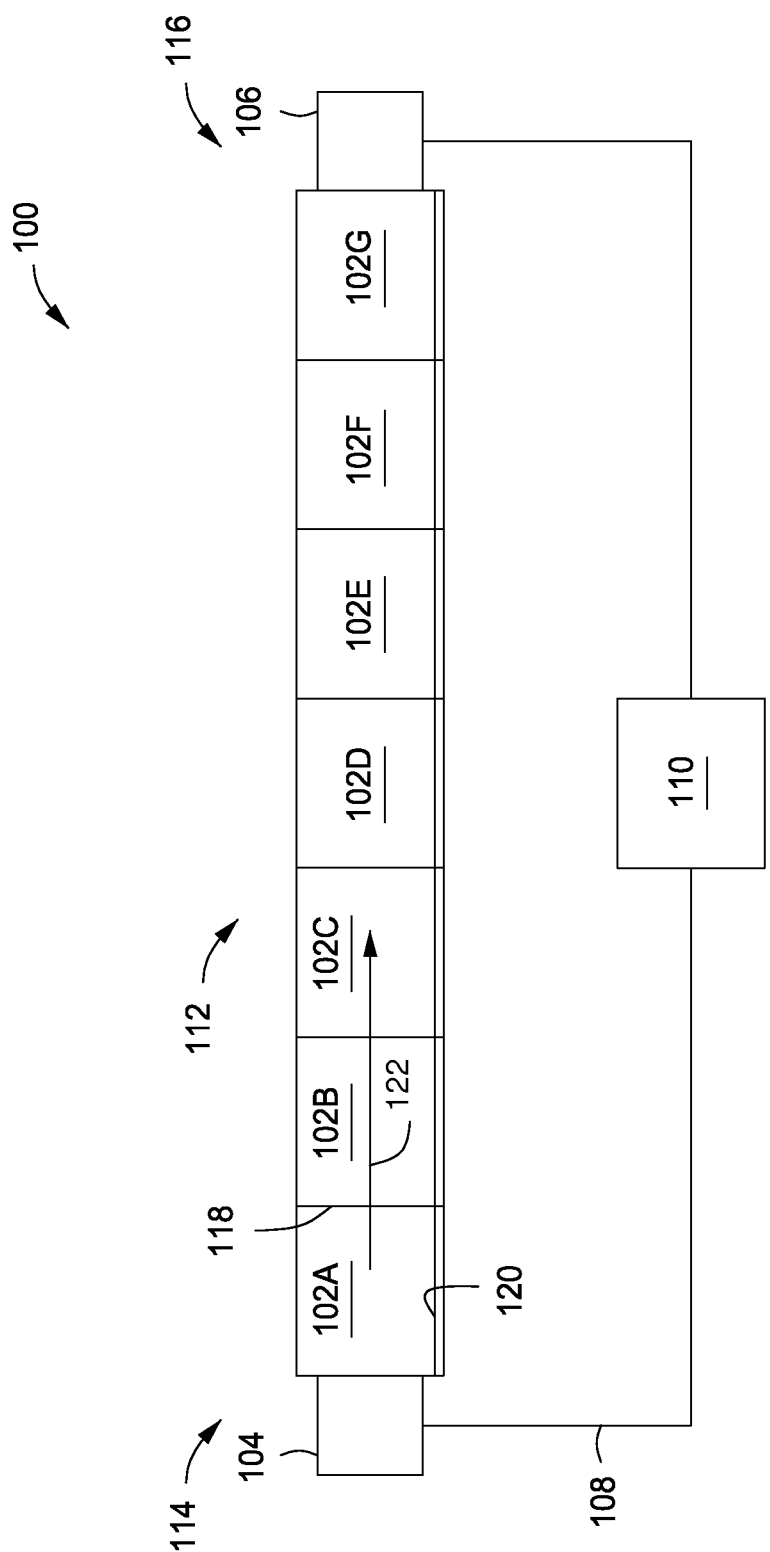

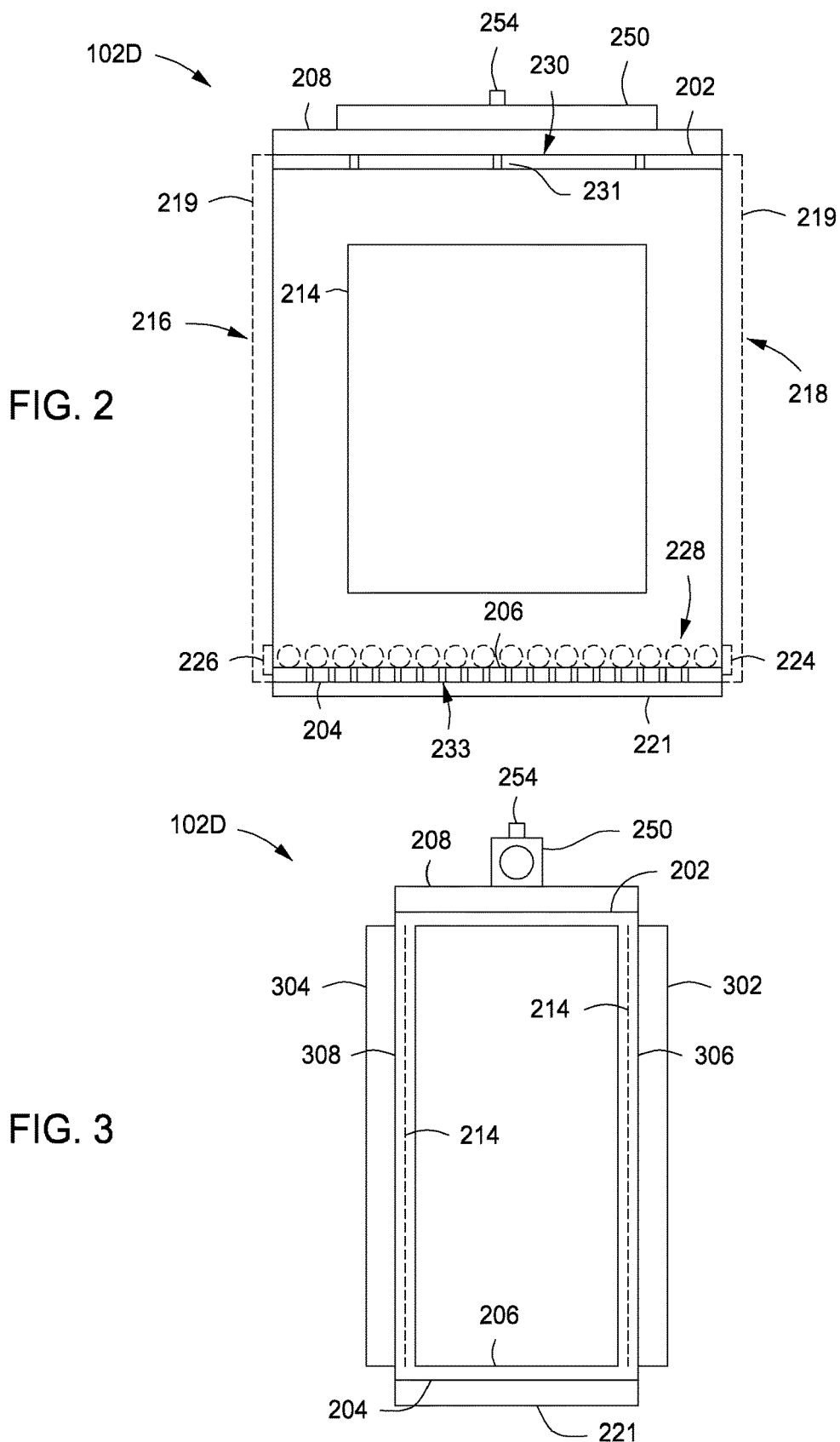

INDEXED GAS JET INJECTOR FOR SUBSTRATE PROCESSING SYSTEM

FIELD

Embodiments of the present invention generally relate to semiconductor processing equipment.

BACKGROUND

Amorphous and polycrystalline solar cells are limited in their efficiency to convert light into energy. Single crystal high mobility materials are capable of much higher efficiency, but are typically much more expensive. Conventional equipment is designed for semiconductor applications with extreme requirements and with a very high cost involved. However, these systems all have high cost and are not capable of high throughput automation.

To achieve very low cost epitaxial deposition for photovoltaic applications at high throughput, the inventors believe that a radical change is required rather than simply making everything larger. For example, the inventors have observed that batch reactors are limited in throughput with high cost of materials, consumables, and automation challenges. Very high flow rates of hydrogen, nitrogen, water, and precursors are also required. Furthermore, a large amount of hazardous byproducts are generated when growing thick films.

Continuous reactors have been attempted many times for epitaxial processes but have never been production worthy nor achieved good precursor usage. The major issue is poor film quality and excessive maintenance.

On the other hand, single wafer reactors have very inefficient utilization of precursors and power (electrical) and have lower per wafer throughput. Plus single wafer reactors need complex substrate lift/rotation mechanisms. Thus, although single wafer reactors can have very high quality, low metal contamination levels, and good thickness uniformity and resistivity, the cost per wafer is very high to get these results.

Therefore, the inventors have provided embodiments of a substrate processing tool that may provide some or all of high precursor utilization, simple automation, low cost, and a relatively simple reactor design having high throughput and process quality.

SUMMARY

Apparatus for use in a substrate processing chamber are provided herein. In some embodiments, a indexed jet injector for use in a process chamber may include a body having a substantially cylindrical central volume, a gas input port disposed on a first surface of the body, a gas distribution channel formed in the body fluidly coupled to the gas input port and to the cylindrical central volume, a gas distribution drum disposed within the cylindrical central volume and rotatably coupled to the body, the gas distribution drum having a plurality of jet channels formed through the gas distribution drum, and a plurality of indexer output ports formed on a second surface of the body, wherein each of the plurality of jet channels fluidly couple the gas input port to at least one of the plurality of indexer output ports at least once per 360° rotation of the gas distribution drum.

In some embodiments, a substrate processing tool may include a substrate carrier configured to support one or more substrates when disposed thereon; and a first substrate processing module including: an enclosure having a lower surface to support the substrate carrier and a gas injector assembly forming a top of the enclosure that provides one or more processing gases into the enclosure; an indexed jet injector disposed above the gas injector assembly, the indexed jet injector including a body having a substantially cylindrical central volume, a gas input port disposed on a first surface of the body, a gas distribution drum disposed within the cylindrical central volume and rotatably coupled to the body, the gas distribution drum having a plurality of jet channels formed through the gas distribution drum, and a plurality of indexer output ports formed on a second surface of the body; and an exhaust disposed opposite the gas injector assembly to remove process gases from the enclosure.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

FIG. 1 depicts an indexed inline substrate processing tool in accordance with some embodiments of the present invention;

FIG. 2 is a cross sectional view of a module of a substrate processing tool in accordance with some embodiments of the present invention;

FIG. 3 is a module of a substrate processing tool in accordance with some embodiments of the present invention;

Figure 4A:
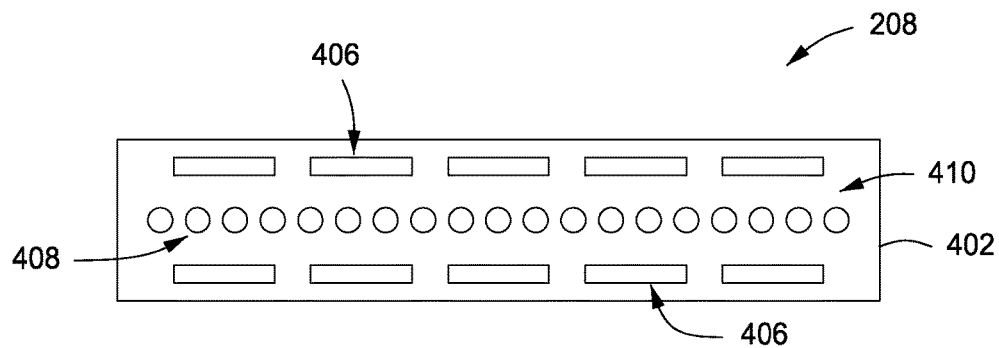
FIG. 4A is a schematic top view of a gas inlet in accordance with some embodiments of the present invention.

To facilitate understanding, identical reference numerals have been used, where possible, to designate identical elements that are common to the figures. The figures are not drawn to scale and may be simplified for clarity. In this document, relational terms such as first and second, top and bottom, and the like may be used solely to distinguish one entity or action from another entity or action without necessarily requiring or implying any actual such relationship or order between such entities or actions. It is contemplated that elements and features of one embodiment may be beneficially incorporated in other embodiments without further recitation.

DETAILED DESCRIPTION

Embodiments of a high volume, low cost system for epitaxial silicon deposition are provided herein. While not limiting in scope, the inventors believe that the inventive substrate processing system may be particularly advantageous for solar cell fabrication applications.

The inventive system may advantageously provide cost effective and simple manufacturability and an energy and cost efficient usage, as compared to conventional substrate processing tools utilized to perform multi-step substrate processes.

For example, basic design components are based on flat plates to simplify manufacturing and contain cost by using readily available materials in standard forms to keep cost down. High reliability linear lamps can be used. The specific lamps can be optimized for the specific application. The lamps may be of the type typically used in epitaxial deposition reactors. Flow fields within the system can also be optimized for each specific application to minimize waste. The design minimizes purge gas requirements and maximizes precursor utilization. Cleaning gas may be added to an exhaust system to facilitate removal of deposited material from the exhaust channels. Load and unload automation can also be separated to facilitate inline processing. Complex automation can be handled offline. Substrates are pre-loaded on carriers (susceptors) for maximum system flexibility, thereby facilitating integration to other steps. The system provides for flexibility of the system configuration. For example, multiple deposition chambers (or stations) can be incorporated for multilayer structures or higher throughput.

Embodiments of a high volume, low cost system for epitaxial silicon deposition may be performed using a standalone substrate processing tool, a cluster substrate processing tool or an indexed inline substrate processing tool. FIG. 1 is an indexed inline substrate processing tool 100 in accordance with some embodiments of the present invention. The indexed inline substrate processing tool 100 may generally be configured to perform any process on a substrate for a desired semiconductor application. For example, in some embodiments, the indexed inline substrate processing tool 100 may be configured to perform one or more deposition processes, for example, such as an epitaxial deposition process.

The indexed inline substrate processing tool 100 generally comprises a plurality of modules 112 (first module 102A, second module 102B, third module 102C, fourth module 102D, fifth module 102E, sixth module 102F, and seventh module 102G shown) coupled together in a linear arrangement. A substrate may move through the indexed inline substrate processing tool 100 as indicated by the arrow 122. In some embodiments, one or more substrates may be disposed on a substrate carrier, for example, such as the substrate carrier 602 described below with respect to FIG. 6 to facilitate movement of the one or more substrates through the indexed inline substrate processing tool 100.

Each of the plurality of modules 112 may be individually configured to perform a portion of a desired process. By utilizing each of the modules to perform only a portion of a desired process, each module of the plurality of modules 112 may be specifically configured and/or optimized to operate in a most efficient manner with respect to that portion of the process, thereby making the indexed inline substrate processing tool 100 more efficient as compared to conventionally used tools utilized to perform multi-step processes.

In addition, by performing a portion of a desired process in each module, process resources (e.g., electrical power, process gases, or the like) provided to each module may be determined by the amount of the process resource required only to complete the portion of the process that the module is configured to complete, thereby further making the inventive indexed inline substrate processing tool 100 more efficient as compared to conventionally used tools utilized to perform multi-step processes.

Furthermore, separate modules advantageously allow for depositing layers of differing dopants on one or more substrates: for example, 10 microns of p++ dopants; 10 microns of p+ dopants; 10 microns of n dopants. Meanwhile, conventional single chambers prohibit deposition of different dopants since they interfere with each other. In addition, inline linear deposition where an epitaxial layer is built up in separate chambers helps to prevent over growth or bridging of the epitaxial Silicon (Si) from the substrate over the carrier due to use of a purge gas between modules (discussed below), providing an etch effect during the transfer stage from one module to the next.

In an exemplary configuration of the indexed inline substrate processing tool 100, in some embodiments, the first module 102A may be configured to provide a purge gas to, for example, remove impurities from the substrate and/or substrate carrier and/or introduce the substrate into a suitable atmosphere for deposition. The second 102B module may be configured to preheat or perform a temperature ramp to raise a temperature of the substrate to a temperature suitable for performing the deposition. The third module 102C may be configured to perform a bake to remove volatile impurities from the substrate prior to the deposition of the materials. The fourth module 102D may be configured to deposit a desired material on the substrate. The fifth module 102E may be configured to perform a post-deposition process, for example such as an annealing process. The sixth module 102F may be configured to cool the substrate. The seventh module 102G may be configured to provide a purge gas to, for example, remove process residues from the substrate and/or substrate carrier prior to removal from the indexed inline substrate processing tool 100. In embodiments where certain processes are not needed, the module configured for that portion of the process may be omitted. For example, if no anneal is needed after deposition, the module configured for annealing (e.g., the fifth module 102E in the exemplary embodiment above) may be omitted or may be replaced with a module configured for a different desired process.

Some embodiments of substrate processing tool 100 include an inline "pushing mechanism" (not shown) or other mechanism that is able to serially transfer the abutting substrate carriers through modules 102A-102G. For example, indexed transport can use a pneumatic plunger-type push mechanism to drive carrier modules forward through the in-line reactor.

Some or all of the plurality of modules may be isolated or shielded from adjacent modules, for example by a barrier 118, to facilitate maintaining an isolated processing volume with respect to other modules in the indexed inline substrate processing tool 100. For example, in some embodiments, the barrier 118 may be a gas curtain, such as of air or of an inert gas, provided between adjacent modules to isolate or substantially isolate the modules from each other. In some embodiments, gas curtains can be provided along all four vertical walls of each module, or of desired modules (such as deposition or doping modules), to limit unwanted cross-contamination or deposition in undesired locations of the module or carriers. Such isolation also prevents contaminants such as carbon or moisture from reaching the reaction zone/substrates.

In some embodiments, the barrier 118 may be a gate or door that can open to allow the substrate carrier to move from one module to the next, and can be closed to isolate the module. In some embodiments, the indexed inline substrate processing tool 100 may include both gas curtains and gates, for example, using gas curtains to separate some modules and gates to separate other modules, and/or using gas curtains and gates to separate some modules. Once the push mechanism delivers the substrate carriers to a desired position in each chamber, a door/gate assembly (and chamber liner elements) forms a seal around the substrate carrier to form an enclosed region within each chamber. As the door mechanism is opening or closing a gas flow (i.e., gas purge, or gas curtain) is provided between each door and its adjacent carriers to prevent cross-contamination between chambers. The provided gas flow is received by one or more exhaust ports that are disposed in the bottom of the processing tool 100.

In some embodiments, isolation is provided by purge gas curtains using nitrogen or argon gas depending on the location of the gas curtain. For example, the gas curtain in the hotter processing regions would be formed using argon gas. The gas curtains in colder regions near the gates, away from the hotter processing regions, could be nitrogen to minimize cost of operation. The nitrogen gas curtains can only be used in cold, inert sections of each module.

In some embodiments, a load module 104 may be disposed at a first end 114 of the indexed inline substrate processing tool 100 and an unload module 106 may be disposed at a second end 116 of the indexed inline substrate processing tool 100. When present, the load module 104 and unload module 106 may facilitate providing a substrate to, and removing a substrate from, the indexed inline substrate processing tool 100, respectively. In some embodiments, the load module 104 and the unload module 106 may provide vacuum pump down and back to atmospheric pressure functions to facilitate transfer of substrates from atmospheric conditions outside of the indexed inline substrate processing tool 100 to conditions within the indexed inline substrate processing tool 100 (which may include vacuum pressures). In some embodiments, one or more substrate carrier transfer robots may be utilized to provide and remove the substrate carrier from the load module 104 and the unload module 106, thereby providing an automated loading and unloading of the substrate carrier to and from the indexed inline substrate processing tool 100.

In some embodiments, a track 120 may be provided along the axial length of the indexed inline substrate processing tool 100 to facilitate guiding the substrate carrier through the indexed inline substrate processing tool 100. The track 120 may be provided along a floor of a facility or other base surface upon which the indexed inline substrate processing tool 100 is mounted. In such embodiments, each module may be configured to be assembled such that the track 120 may be positioned along an exposed bottom portion of the module to facilitate moving the substrate carrier along the track 120 and through each respective module. Alternatively, the track 120 may be mounted to a bottom surface of the modules once assembled in a linear array. Alternatively, portions of the track 120 may be mounted to a bottom surface of each individual module such that the complete track 120 is formed after assembly of all of the modules in a linear array. In some embodiments, the track 120 may include wheels, ball bearings or other types of rollers to facilitate low friction movement of the substrate carrier along the track 120. In some embodiments, the track 120 may be fabricated from or may be coated with a low friction material, such as described below with respect to FIG. 2, to facilitate low friction movement of the substrate carrier along the track 120.

In some embodiments, a cleaning module 110 may be disposed between the load module 104 and the unload module 106. When present, the cleaning module 110 may clean and/or prepare the substrate carrier to receive another one or more substrates for a subsequent run through the indexed inline substrate processing tool 100 (as indicated by the return path arrow 108). As such, the substrate carriers may be re-used multiple times.

FIG. 2 depicts a cross sectional view of an exemplary configuration of a module, such as module 102D, that may be used as one or more of the modules of the plurality of modules 112 described above, and in some embodiments, as a module configured for the deposition of materials on a substrate. Although generally discussed below in terms of a specific module (102D), the below discussion generally applies to all modules with the exception of components and/or configurations only specifically required for a deposition process.

Referring to FIG. 2, in some embodiments, the module 102D generally comprises an enclosure 202. The enclosure 202 may be fabricated from any material suitable for semiconductor processing, for example, a metal such as aluminum, stainless steel, or the like. The enclosure 202 may have any dimensions suitable to accommodate a substrate carrier (e.g., substrate carrier 602 described below) configured to carry one or more substrates of a given size as well as to facilitate a desired flow rate and profile. For example in some embodiments, the enclosure may have a height and length of about 24 inches or about 36 inches and a depth of about 6 inches.

In some embodiments, the enclosure 202 may be assembled by coupling a plurality of plates together to form the enclosure 202. Each enclosure 202 may be configured to form a particular module (e.g., module 102D) that is capable of performing a desired portion of a process. By assembling the enclosure 202 in such a manner, the enclosure 202 may be produced in multiple quantities for multiple applications via a simple and cost effective process.

A lower surface 206 of the enclosure supports the substrate carrier and provides a path for the substrate carrier to move linearly through the module 102D to an adjacent module of the plurality of modules. In some embodiments, the lower surface 206 may be configured as the track 120. In some embodiments, the lower surface 206 may have the track 120, or a portion thereof, coupled to the lower surface 206. In some embodiments, the lower surface 206, or the track 120, may comprise a coating, for example, a dry lubricant such as a nickel alloy (NiAl) containing coating, to facilitate movement of the substrate carrier through the module 102D. Alternatively, or in combination, in some embodiments, a plurality of rollers (shown in phantom at 228) may be disposed above the lower surface 206 to facilitate movement of the substrate carrier through the module 102D. In such embodiments, the plurality of rollers 228 may be fabricated from any material that is non-reactive to the process environment, for example, such as quartz ($SiO_2$).

In some embodiments, a barrier 219 may be disposed proximate the first end 216 and/or second end 218 of the enclosure 202 (e.g., to form the barrier 118 as shown in FIG.

1). When present, the barrier 219 isolates each module of the plurality of modules from an adjacent module to prevent cross contamination or mixing of environments between modules. In some embodiments, the barrier 219 may be a stream of gas, for example a purge gas, provided by a gas inlet (e.g., such as the gas inlet 208) disposed above the module 102D. Alternatively, or in combination, in some embodiments, the barrier 219 may be a movable gate. The gate provides additional isolation for certain processes, for example, during the deposition part of the sequence. In some embodiments, one or more notches (two notches 224, 226 shown) may be formed in the gate to facilitate securing the substrate carrier in a desired position within the module 102D and/or to form a seal between the substrate carrier and the barrier 219 during processing.

In some embodiments, the gate may be fabricated from a metal, such as aluminum, polished stainless steel, or the like. In other embodiments, the gates in hotter regions of the processing system can be made out of quartz to withstand the high temperatures.

In some embodiments, the module 102D may comprise one or more windows disposed in one or more sides of the enclosure, for example such, as the window 214 disposed in the enclosure 202, as shown in FIG. 2. When present, the window 214 allows radiant heat to be provided into the enclosure 202 from, for example, a radiant heat lamp disposed on a side of the window 214 opposite the interior of the enclosure 202. The window 214 may be fabricated from any material suitable to allow the passage of radiant heat through the window 214 while resisting degradation when exposed to the processing environment within the enclosure 202. For example, in some embodiments, the window 214 may be fabricated from quartz ($SiO_2$).

In some embodiments, the module 102D may include a gas inlet 208 disposed proximate a top 230 of the enclosure 202 to provide one or more gases into the enclosure 202 via through holes 231 formed in the enclosure 202. The gas inlet 208 may be configured in any manner suitable to provide a desired process gas flow to the enclosure 202. The gas inlet 208 is described below in detail with respect to FIGS. 4A-E. Gas may be supplied to the gas inlet via an indexed jet injector 250 disposed above gas inlet 208. In some embodiments, the indexed jet injector 250 bolts to a top plate of the module 102 and is coupled to the gas inlet 208. The indexed jet injector 250 may include a gas input port 254 for receiving gas, and may provide gas to gas inlet 208 as discussed below with respect to FIG. 5. Gas injection may be provided between the two substrate carriers to contain the process gases in the reaction zone between the two substrate carriers, and/or purge gases between the substrate carriers and the module walls.

In some embodiments, the module 102D may comprise an exhaust 221 coupled to a portion of the enclosure 202 opposite the gas inlet 208 (e.g. the bottom 204) to facilitate the removal of gases from the enclosure 202 via passageways 233 formed in the bottom 204 of the enclosure 202.

Referring to FIG. 3, in some embodiments, the module 102D may include one or more heating lamps (two heating lamps 302, 304 shown) coupled to the sides 306, 308 of the enclosure 202. The heating lamps 302, 304 provide radiant heat into enclosure 202 via the windows 214. The heating lamps 302, 304 may be any type of heating lamp suitable to provide sufficient radiant heat into the enclosure to perform a desired portion of a process within the module 102D. For example, in some embodiments, the heating lamps 302, 304 may be linear lamps or zoned linear lamps capable of providing radiant heat at a wavelength of about 0.9 microns, or in some embodiments, about 2 microns. The wavelengths used for lamps in various modules may be selected based upon the desired application. For example, the wavelength may be selected to provide a desired filament temperature. Low wavelength bulbs are less expensive, use less power, and can be used for preheating. Longer wavelength bulbs provide high power to facilitate providing higher process temperatures, for example, for deposition processes.

In some embodiments, Infrared (IR) lamps may be provided in one or more zones to provide heat energy to the substrate carriers and ultimately to the substrates. Portions of the chamber where no deposition is desired, such as the windows, may be fabricated of materials that will not absorb IR light energy and heat up. Such thermal management keeps deposition substantially contained to desired areas. The one or more zones of IR lamps, for example in horizontal bands from top to bottom of sides of the module, facilitate controlling vertical temperature gradients to compensate for depletion effects or other vertical non-uniformities of deposition or other processing. In some embodiments, temperature can also be modulated over time as well as between zones. This type of granular temperature control, in addition to the gas injection modulation described above with respect to FIG. 4, or combinations thereof, can facilitate control of substrate processing results from top to bottom of the substrates as well as lateral edge to edge (for example, a thickness of a deposited film or uniformity of dopant concentration and/or depth).

FIG. 4A depicts some embodiments or the gas inlet 208, which may comprise a gas distribution plate 402 having a plurality of gas orifices 410. The gas orifices 410 may be configured to provide a desired flow of process gases into the enclosure 202. For example, in some embodiments, the gas orifices 410 may comprise a plurality of inner gas holes 408 and a plurality of outer gas slots 406, such as shown in FIG. 4A. In such embodiments, the inner gas holes 408 may provide a high velocity jet flow of process gases to a central area of the enclosure 202 to facilitate a process. In some embodiments, outer gas slots 406 may provide a lower velocity laminar flow of process gases over substrates disposed in the substrate carriers.

In addition, outer gas slots 406 may be disposed on either side of the inner gas holes 408, closer to the walls of the module but still within the reaction zone, and to account for the angle of the substrate supports (e.g., outer gas slots 406 may be disposed closer to the walls for substrate support disposed at about a 6° angle than for a substrate support disposed at about a 3° angle). In some embodiments, the outer gas slots 406 inject process gases perpendicular to the injector. In other embodiments, the outer gas slots 406 may be configured or adjusted to flow process gases parallel to the substrate support surfaces (e.g., the outer gas slots 406 may be angled to provide laminar flow across the surface of the substrates at the same angle that the substrate support carrier supports the substrates).

Figure 4B:
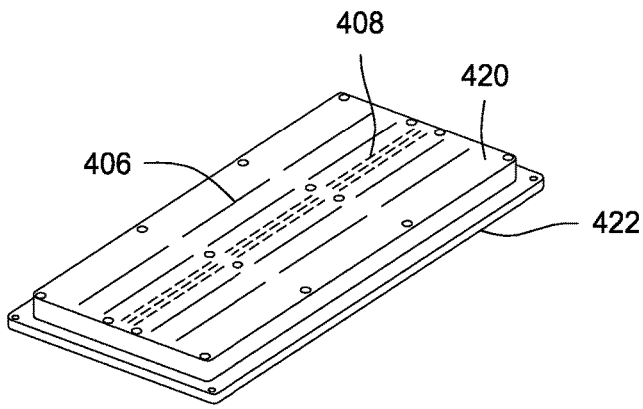
FIGS. 4B and 4C respectively depict an isometric view and an exploded isometric view of another gas inlet in accordance with some embodiments of the present invention.
Figure 4C:
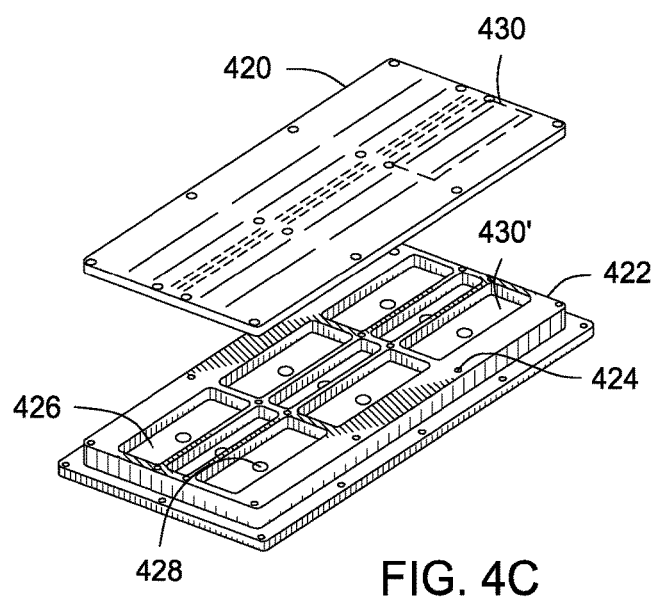

Referring to FIGS. 4B and 4C, in some embodiments, the gas distribution plate 402 of gas inlet 208 may comprise an injector plate 420 coupled to base plate 422. Injector plate 420 may be coupled to base plate 422 via fasteners using fastener holes 424, or may be bonded together in a manner suitable to withstand the environmental conditions produced during substrate processing. In some embodiments, base plate 422 may include a plurality of plenums 426 (as depicted in FIG. 4C). Each plenum 426 may receive one or more process gases via one or more inlets 428 disposed in each plenum 426.

As shown in FIG. 4C, separate zones of inner gas holes 408 and outer gas slots 406 may be associated with each plenum 426, and gas injection via each of the zones may be modulated accordingly. For example, in FIG. 4C, zone 430 on injector plate 420 includes outer gas slots 406 that correspond with plenum zone 430'. In some embodiments, gas injection via the different zones of inner gas holes 408 and outer gas slots 406 may be modulated temporally and/or spatially by starting, stopping, and/or varying the flow rates of the gases over time and/or from one plenum 426 to another (for example, from one end to the other of the module). Gas injection via inner gas holes 408 and outer gas slots 406 may also be modulated by dynamically adjusting through the use of fine tuning (for example flow controllers or valves as shown in FIG. 4E and described below) which are able to control flow rates and/or which holes 408 or slots 406 (or zones of holes 408 or slots 406) are used. That is, some embodiments of gas inlet 208 include a gas distribution plate 402 that has a plurality of zones that are able to dynamically adjust the spatial (e.g., row-by-row, column-by-column or by region of the carrier) and/or temporal delivery of the gases to the substrates. This may, for example, assure that the substrates that are farthest from gas distribution plate 402 in the processing chamber will include deposited layers that have similar physical, electrical, and structural properties as layers deposited on substrates that are disposed closer to the gas distribution plate 402.

The gas distribution plate 402, including injector plate 420 and base plate 422, may be fabricated from any suitable material, for example, such as transparent or non-transparent quartz ($SiO_2$). The heat transfer coefficient of the material used for the gas distribution plate 402, or the transparency of the quartz used, may be selected to control heating of the gas inlet 208 by the lamps and to prevent or limit undesired deposition of material onto the gas inlet 208 during substrate processing.

Figure 4D:
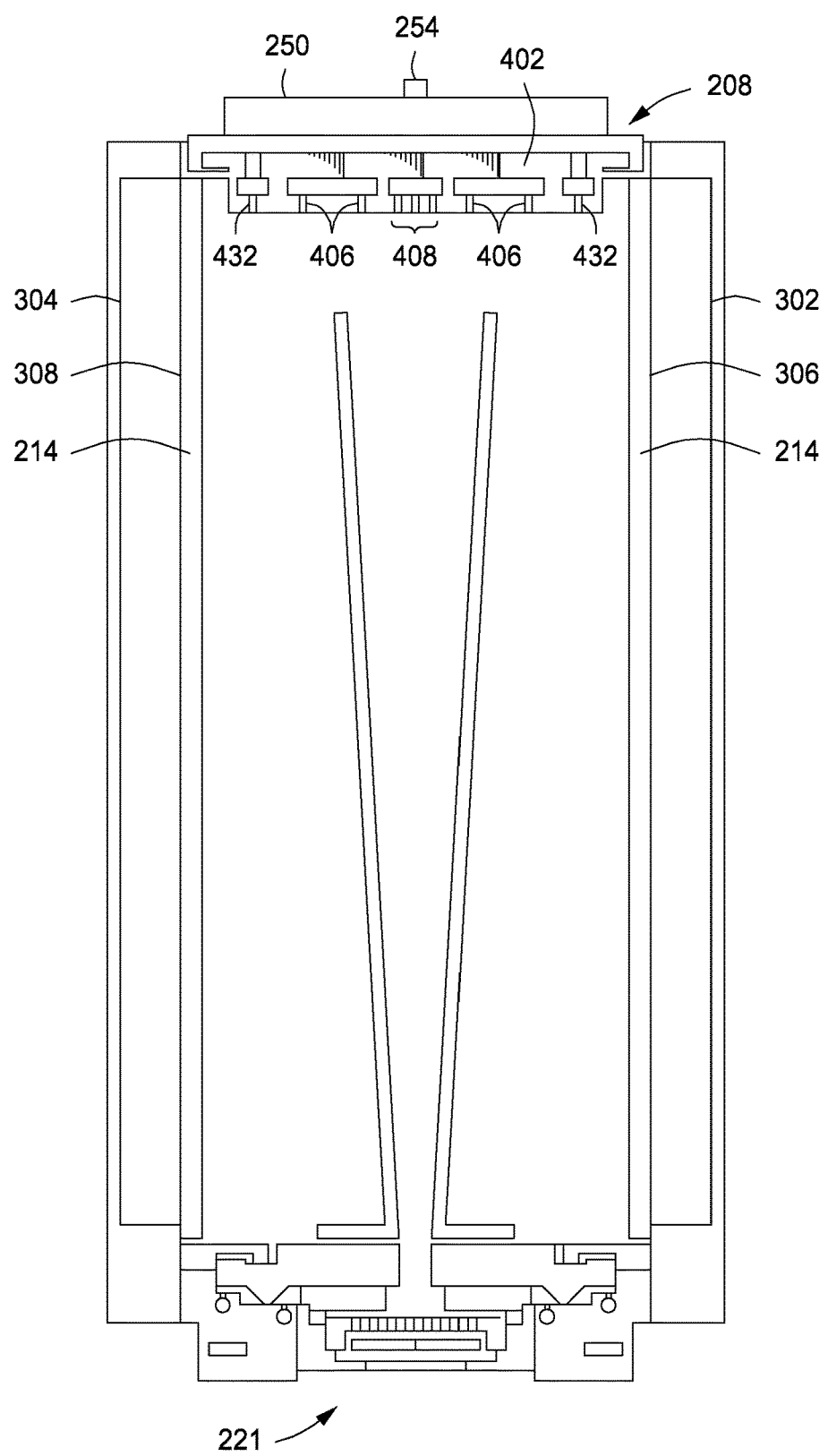
FIG. 4D is a schematic cross-section side of a gas inlet disposed in a substrate processing module in accordance with some embodiments of the present invention.
Figure 4E:
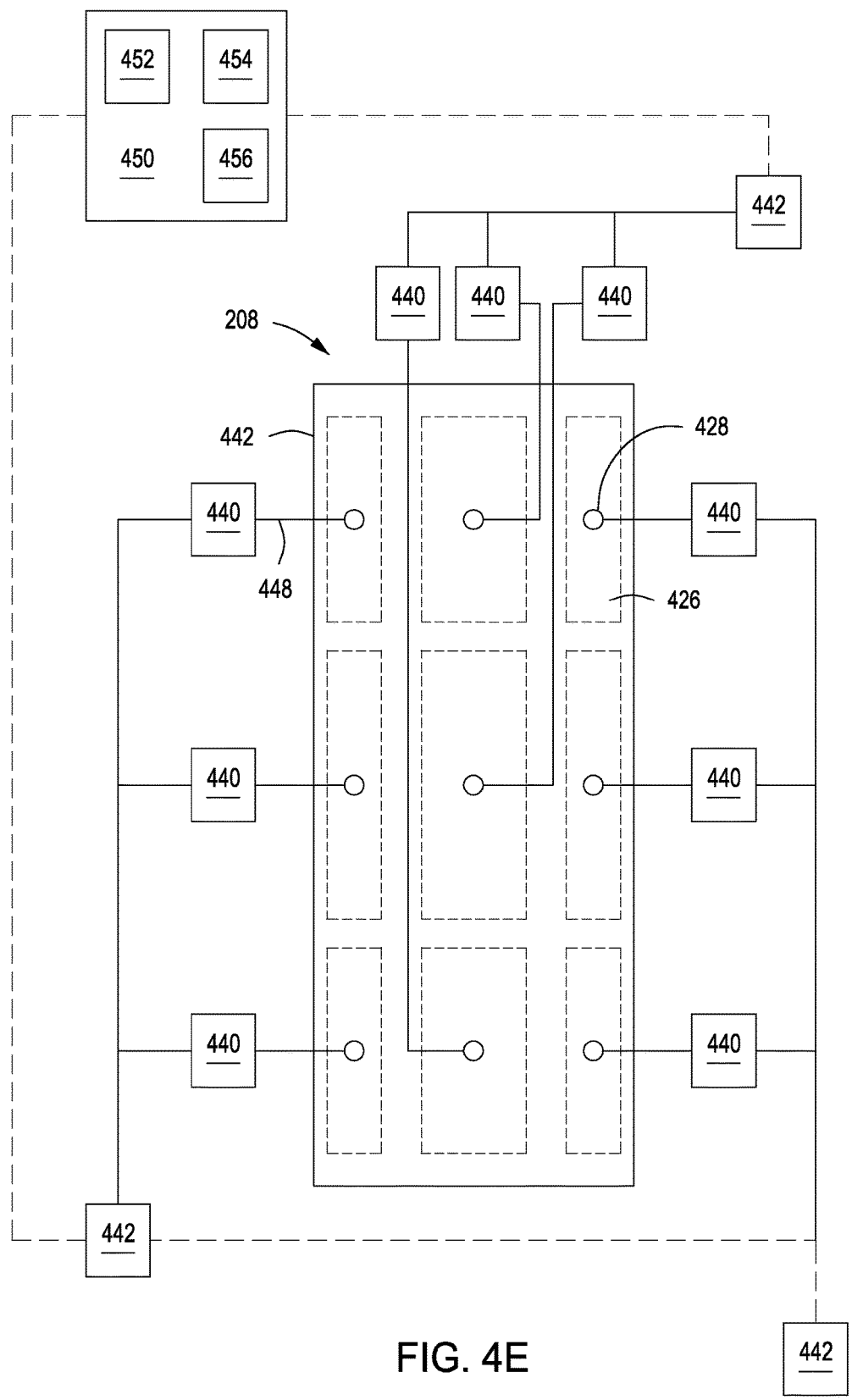
FIG. 4E is a schematic block diagram showing an exemplary gas flow control system in accordance with some embodiments of the present invention.

FIG. 4D depicts a side view of gas inlet 208 disposed in module 102D. As shown in FIG. 4D, gas inlet 208 may include another set of purge gas slots 432 to provide a purge curtain as barrier 118 (or in combination with a gate, when gates or doors are used as the barrier), as discussed above with respect to FIG. 1. The purge curtain can be provided along all four vertical walls of each module by the purge gas slots, or of desired modules (such as deposition or doping modules), to limit unwanted cross-contamination or deposition in undesired locations of the module or carriers. That is, the purge gas slots 432 may provide flow of purge gas to one or more cold zones within the enclosure (e.g., proximate the windows 214 and/or gates or doors, as described above) to reduce or eliminate unwanted deposition of materials within the cold zones. An indexed jet injector 250 may be disposed above, and coupled to, gas inlet 208. The indexed jet injector 250 may include a gas input port 254 for receiving gas, and may provide gas to gas inlet 208 in a variety of ways as discussed below with respect to FIG. 5.

Referring to FIG. 4E, as discussed above, some embodiments of gas inlet 208 include a gas distribution plate 402 that has a plurality of zones that are able to dynamically adjust the spatial (e.g., row-by-row, column-by-column or by region of the carrier) and/or temporal delivery of the gases to the substrates. In some embodiments, each of the inlets 428 that supply process gases to each of the plenums 426 may be coupled to a mass flow controller 440 (via a gas supply conduit 448). The flow controllers may include valves, mass flow, controllers, and the like. The flow controllers 440 may be coupled gas supplies 442. In some embodiments, gas supplies 442 may be the same gas species or different gas species. Although not shown, in some embodiments, purge gas slots 432 may also be coupled to one or more flow controllers 440 and gas supplies 442. The flow controllers 440 and gas supplies 442 may be operatively coupled to a controller 450 to control the amount, timing and concentration of the one or more process gases supplied. The controller 450 includes a central processing unit (CPU) 452, a memory 454, and support circuits 456. The controller 450 may be one of any form of general-purpose computer processor that can be used in an industrial setting for controlling various substrate processing tools or components thereof. The memory, or computer readable medium, 454 of the controller 450 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 456 are coupled to the CPU 452 for supporting the processor in a conventional manner. These circuits include cache, power supplies, clock circuits, input/output circuitry and subsystems, and the like. Inventive methods as described herein may be stored in the memory 454 as software routine that may be executed or invoked to control the operation of the gas inlet 208 in the manner described herein. The software routine may also be stored and/or executed by a second CPU (not shown) that is remotely located from the hardware being controlled by the CPU 452.

FIGS. 5A-5D are schematic cross-section top, side, bottom and end views, respectively, of an indexed jet injector 250 in accordance with some embodiments of the present invention. As discussed above, gas inlet 208 produces laminar flow fields via outer gas slots 406 over the substrate which results in high depletion of the chemical precursor over upper portions of the substrate. Jet flow provided via the inner gas holes 408 replenishes unreacted precursor to the depleted regions. High velocity is required for the jet flow to function properly. Thus, rather than use a larger amount of precursor to have all jets flow simultaneously, the jets can be utilized sequentially such that some of the inner gas holes 408 are used to provide gas to the chamber while other remain inactive. The inventors developed the indexed jet injector 250 to provide gas to gas inlet 208 to facilitate this functionality that advantageously allows gas flow fields to be optimized for each specific application to maximize the versatility and scalability of the system.

The indexed jet injector 250 includes a body 502 having a substantially cylindrical central volume. In some embodiments, a rotary gas distribution drum 504 is disposed within the cylindrical central volume of the body 502 and configured to rotate within the cylindrical central volume (i.e., the gas distribution drum 504 is rotatably coupled to body 502). A stepper motor 520 may be coupled to gas distribution drum 504 via shaft 522 to rotate, or index, the gas distribution drum 504 within the central volume of body 502. In some embodiments, the inner surface of body 502 and the outer surface of gas distribution drum 504 may be finished, lubricated, or otherwise treated such that gas distribution drum 504 freely rotates within the central volume of body 502. In other embodiments, bearings, bushings, and the like may be used to facilitate the rotation of gas distribution drum 504. The indexed jet injector 250 and stepper motor 520 may be hermetically sealed from the rest of the processing environment in module 102 to prevent undesired cross contamination.

Figure 5A:
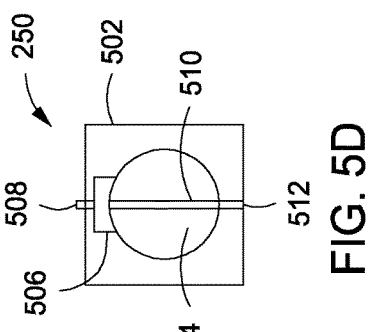
FIGS. 5A-5D are schematic cross-section top, side, bottom and end views, respectively, of an indexed jet injector in accordance with some embodiments of the present invention.

In some embodiments, gas may be supplied to the indexed jet injector 250 via one or more gas inlet ports 508. Although one exemplary input port is shown in FIGS. 5A-5D, multiple gas inlet ports 508 may be used. The gas inlet ports 508 may be fluidly coupled to one or more gas distribution channels 506 formed in body 502. The gas distribution channel 506 is fluidly coupled to the central volume of the body 502 by one or more holes 514 formed at the bottom of the gas distribution channels 506. In some embodiments, the gas distribution channel 506 is formed proximate an upper portion of the body 502. In alternate embodiments, the gas distribution channel 506 may be formed on a side, end or bottom of the body 502. In some embodiments, there may be one continuous gas distribution channel 506 formed in body 502 as shown in FIG. 5A. In other embodiments, gas distribution channel 506 may be divided into multiple zones for added tunability. In some embodiments, a plurality of indexer outputs 512 are formed through a bottom portion of the body 502. In other embodiments the plurality of indexer outputs 512 may be formed on another portion of the body 502 base on where the gas distribution channel 506 is formed. The plurality of indexer outputs 512 fluidly couple the indexed jet injector 250 to the gas inlet 208 that is disposed beneath indexed jet injector 250.

Figure 5B:
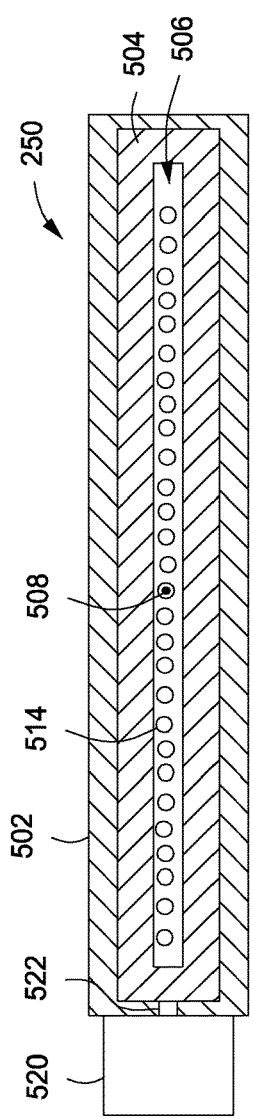
Figure 5C:
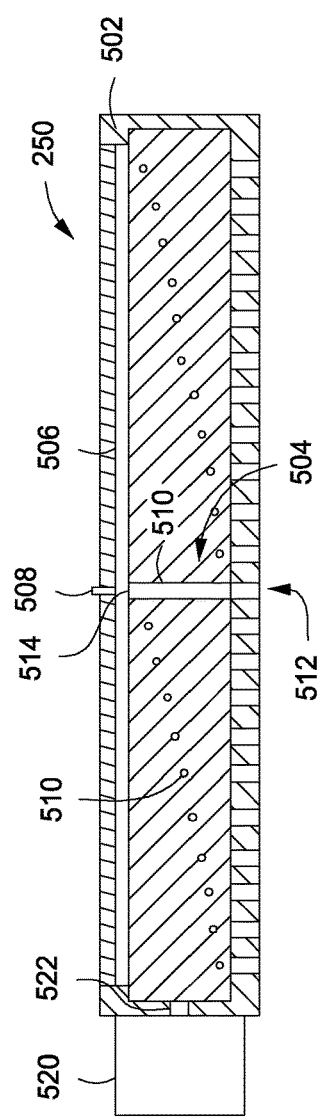
Figure 5D:
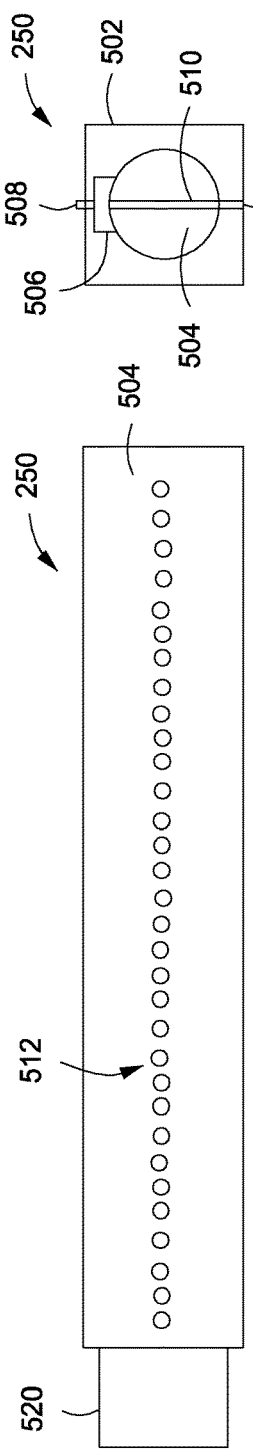

In some embodiments, the gas distribution drum 504 may be a cylinder with a plurality of jet channels 510 formed completely through the drum 504. In some embodiments, each of the plurality of jet channels 510 will align with gas distribution channel 506 at least twice for every 360° rotation of gas distribution drum 504. In some embodiments, when a first end of a jet channel 510 aligns with a hole 514 in gas distribution channel 506, a second end will align with at least one indexer output 512, thereby fluidly coupling the gas input port 508 to the indexer output 512, and thereby the gas inlet 208 disposed below indexed jet injector 250. In some embodiments, the jet channels 510 may be drilled or otherwise machined equidistantly from each other. In some embodiments, groups of a selected number of jet channels 510 may be aligned to facilitate multi-zonal gas distribution. In other embodiments, the jet channels 510 are formed at an angle of Theta=(360 degrees/# of inject holes), as shown in FIG. 5B.

Figure 6:
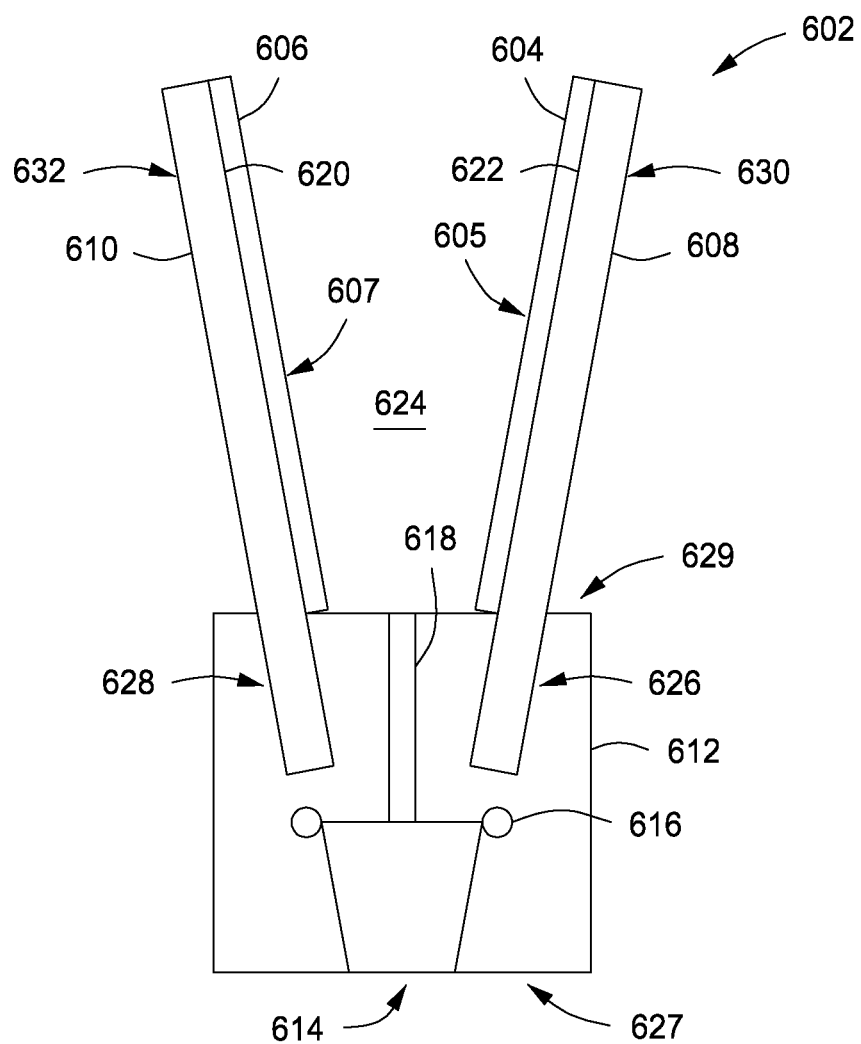
FIG. 6 is a substrate carrier for use in a substrate processing tool in accordance with some embodiments of the present invention.

FIG. 6 depicts at least one exemplary embodiment of a substrate carrier 602 that may be used with embodiments of the present invention described herein. The substrate carrier 602 may support two or more substrates and carry the two or more substrates through the indexed inline substrate processing tool 100 or to a cluster substrate processing tool (not shown). In some embodiments, the substrate carrier 602 may generally include a base 612 and a pair of opposing substrate supports 608, 610. One or more substrates, (substrate 604, 606 shown in FIG. 6) may be disposed on each of the substrate supports 608, 610 for processing. In some embodiments, the substrate supports 608, 610 are secured on substrate carrier 602 and may be held at an acute angle with respect to each other, with the substrates facing each other and defining a reaction zone therebetween. For example, in some embodiments the substrate supports 608, 610 are held at an angle of about between 2 degrees and 10 degrees from vertical.

The base 612 may be fabricated from any material suitable to support the substrate supports 608, 610 during processing, for example such as graphite. In some embodiments, a first slot 626 and a second slot 628 may be formed in the base 612 to allow for the substrate supports 608, 610 to be at least partially disposed within the first slot 626 and second slot 628 to retain the substrate supports 608, 610 in a desired position for processing. In some embodiments, the substrate supports 608, 610 are generally slightly angled outwardly such that the substrate supporting surfaces generally oppose each other and are arranged in a "v" shape. In some embodiments, the base 612 is fabricated from an insulating material and may be either clear or opaque quartz or a combination of clear and opaque quartz for temperature management.

A channel 614 is disposed in a bottom surface 627 of the base 612 and an opening 618 is disposed through the base 612 from a top surface 629 of the base 612 to the channel 614 to form a path for one or more gases to flow through the base 612. For example, when the substrate carrier 602 is disposed in a module, such as the module 102D described above, the opening 618 and channel 614 facilitates a flow of gas from a gas inlet (e.g., gas inlet 208 described above) to an exhaust of the module (e.g., exhaust 221 of module 102D described above). The carrier may be fabricated from quartz with the exhaust and cleaning channels machined into the quartz or a metal base disposed below the quartz. A baffle may be provided to facilitate evening out the flow through the base 612.

In some embodiments, the base 612 may include a conduit 616 disposed within the base 612 and circumscribing the channel 614. The conduit 616 may have one or more openings formed along the length of the conduit 616 to fluidly couple the conduit 616 to the channel 614 to allow a flow of gas from the conduit 616 to the channel 614. In some embodiments, while the substrate carrier 602 is disposed in a module, a cleaning gas may be provided to the conduit 616 and channel 614 to facilitate removal of deposited material from the channel 614. The cleaning gases may be provided proximate one or more exhausts to prevent deposition of process byproducts within the exhaust, thereby reducing downtime necessary for cleaning//maintenance. The cleaning gas may be any gas suitable to remove a particular material from the module. For example, in some embodiments the cleaning gas may comprise one or more chlorine containing gases, such as hydrogen chloride (HCl), chlorine gas (Cl2), or the like. Alternatively, in some embodiments, an inert gas may be provided to the conduit 616 and channel 614 to minimize deposition of material on the channel 614 by forming a barrier between the exhaust gases flowing through the channel and the surfaces of the channel.

The substrate supports 608, 610 may be fabricated from any material suitable to support a substrate 604, 606 during processing. For example, in some embodiments, the substrate supports 608, 610 may be fabricated from graphite. In such embodiments, the graphite may be coated, for example with silicon carbide (SiC), to provide resistance to degradation and/or to minimize substrate contamination.

The opposing substrate supports 608, 610 comprise respective substrate support surfaces 620, 622 that extend upwardly and outwardly from the base 612. Thus, when substrates 604, 606 are disposed on the substrate supports 608, 610, a top surface 605, 607 of each of the substrates 604, 606 face one another. Facing the substrates 604, 606 toward one another during processing advantageously creates a radiant cavity between the substrates (e.g. in the area 624 between the substrate supports 608, 610) that provides an equal and symmetrical amount of heat to both substrates 604, 606, thus promoting process uniformity between the substrates 604, 606.

In some embodiments, during processing, process gases are provided to the area 624 between the substrate supports 608, 610 while a heat source disposed proximate a back side 630, 632 of the substrate supports 608, 610 (e.g., the heating lamps 302, 304 described above) provides heat to the substrates 604, 606. Providing the process gases to the area 624 between the substrate supports 608, 610 advantageously reduces exposure of the process gases to interior components of the modules, thus reducing material deposition on cold spots within the modules (e.g., the walls of the modules, windows, or the like) as compared to conventional processing systems that provide process gases between a heat source and substrate support. In addition, the inventor has observed that by heating the substrates 604, 606 via the back side 630, 632 of the substrate supports 608, 610 any impurities within the module will deposit on the back side 630, 632 of the substrate supports 608, 610 and not the substrates 604, 606, thereby advantageously allowing for the deposition of materials having high purity and low particle count atop the substrates 604, 606.

In operation of the indexed inline substrate processing tool 100 as described in the above figures, the substrate carrier 602 having a first set of substrates disposed in the substrate carrier 602 (e.g. substrates 604, 606) is provided to a first module (e.g. first module 102A). When present, a barrier (e.g., barrier 118 or barrier 219) on the first side and/or the second side of the first module may be closed or turned on to facilitate isolating the first module. A first portion of a process (e.g., a purge step of a deposition process) may then be performed on the first set of substrates. After the first portion of the process is complete, a second substrate carrier having a second set of substrates disposed in a second substrate carrier is provided to the first module. As the second substrate carrier is provided to the first module, the second substrate carrier pushes the first carrier to the second module (e.g., the second module 102B). The first portion of the process is then performed on the second set of substrates in the first module while a second portion of the process is performed on the first set of substrates in the second module. The addition of subsequent substrate carriers repeats to provide each substrate carrier to a fixed position (i.e., within a desired module), thus providing a mechanical indexing of the substrate carriers. As the process is completed in the substrate carriers may be removed from the indexed inline substrate processing tool 100 via an unload module (e.g., unload module 106). As the process is completed, the substrate carriers may be removed from the indexed inline substrate processing tool 100 via an unload module (e.g., unload module 106).

While the foregoing is directed to embodiments of the present invention, other and further embodiments of the invention may be devised without departing from the basic scope thereof.

The invention claimed is:

1. An indexed jet injector for use in a substrate process chamber, comprising:
   a body having a substantially cylindrical central volume;
   a gas input port disposed on a first surface of the body;
   a gas distribution drum disposed within the cylindrical central volume and rotatably coupled to the body, the gas distribution drum having a plurality of jet channels formed through the gas distribution drum; and
   a plurality of indexer output ports formed on a second surface of the body, wherein at least some of the plurality of jet channels fluidly couple the gas input port to at least one of the plurality of indexer output ports at least once per 360° rotation of the gas distribution drum.

2. The indexed jet injector of claim 1, further comprising:
   a gas distribution channel formed in the body and fluidly coupled to the gas input port and to the cylindrical central volume.

3. The indexed jet injector of claim 2, wherein the gas distribution channel includes a plurality of holes that fluidly couple the gas inlet port to the cylindrical central volume.

4. The indexed jet injector of claim 3, wherein each of the plurality of jet channels aligns with one or more of the plurality of holes in the gas distribution channel at least twice for every 360° rotation of gas distribution drum.

5. The indexed jet injector of claim 3, wherein when a first end of a jet channel aligns with one or more of the plurality of holes in the gas distribution channel, a second end of the jet channel aligns with one or more of the plurality of indexer output ports.

6. The indexed jet injector of claim 2, wherein the gas distribution channel is formed proximate an upper portion of the body.

7. The indexed jet injector of any of claim 2, wherein the gas distribution channel is divided into multiple zones.

8. The indexed jet injector of claim 1, further comprising:
   a stepper motor coupled to gas distribution drum via a shaft to rotate or index the gas distribution drum within the central volume of the body.

9. The indexed jet injector of claim 8, wherein the indexed jet injector and the stepper motor are hermetically sealed.

10. The indexed jet injector of claim 1, wherein an inner surface of the body and an outer surface of the gas distribution drum is at least one of machine finished or lubricated.

11. The indexed jet injector of claim 1, further comprising at least one of bearings or bushings to facilitate the rotation of the gas distribution drum.

12. A substrate processing tool, comprising:
    a substrate carrier configured to support one or more substrates when disposed thereon; and
    a first substrate processing module comprising:
      an enclosure having a lower surface to support the substrate carrier and a gas injector assembly forming a top of the enclosure that provides one or more processing gases into the enclosure;
      an indexed jet injector disposed above the gas injector assembly, the indexed jet injector comprising:
        a body having a substantially cylindrical central volume;
        a gas input port disposed on a first surface of the body;
        a gas distribution drum disposed within the cylindrical central volume and rotatably coupled to the body, the gas distribution drum having a plurality of jet channels formed through the gas distribution drum; and
        a plurality of indexer output ports formed on a second surface of the body; and
      an exhaust disposed opposite the gas injector assembly to remove process gases from the enclosure.

13. The substrate processing tool of claim 12, wherein the indexed jet injector further comprises a gas distribution channel formed in the body and fluidly coupled to the gas input port and to the cylindrical central volume.

14. The substrate processing tool of claim 12, wherein each of the plurality of jet channels aligns with one or more of a plurality of holes in the gas distribution channel at least twice for every 360° rotation of gas distribution drum.

15. The substrate processing tool of claim 14, wherein the plurality of holes fluidly couple the gas inlet port to the cylindrical central volume.

16. The substrate processing tool of claim 15, wherein when a first end of a jet channel aligns with one or more of the plurality of holes in the gas distribution channel, a second end of the jet channel aligns with one or more of the plurality of indexer output ports.

17. The substrate processing tool of claim 12, wherein the indexed jet injector further comprises a stepper motor coupled to gas distribution drum via a shaft to rotate or index the gas distribution drum within the central volume of the body.

18. The substrate processing tool of claim 17, wherein the indexed jet injector and the stepper motor are hermetically sealed.

19. The substrate processing tool of claim 12, wherein an inner surface of the body and an outer surface of the gas distribution drum is at least one of machine finished or lubricated.

20. The substrate processing tool of claim 12, further comprising at least one of bearings or bushings to facilitate the rotation of the gas distribution drum.

* * * * *